(12) United States Patent
Ning et al.

(10) Patent No.: US 8,964,386 B2
(45) Date of Patent: Feb. 24, 2015

(54) SERVER SYSTEM

(71) Applicants: Inventec (Pudong) Technology Corporation, Shanghai (CN); Inventec Corporation, Taipei (TW)

(72) Inventors: Qi-Guang Ning, Shanghai (CN); Ji-Peng Xu, Shanghai (CN)

(73) Assignees: Inventec (Pudong) Technology Corporation, Shanghai (CN); Inventec Corporation, Taipei (TW)

( * ) Notice: Subject to any disclaimer, the term of this patent is extended or adjusted under 35 U.S.C. 154(b) by 297 days.

(21) Appl. No.: 13/748,077

(22) Filed: Jan. 23, 2013

(65) Prior Publication Data

US 2014/0085807 A1      Mar. 27, 2014

(30) Foreign Application Priority Data

Sep. 21, 2012   (CN) .......................... 2012 1 0355796

(51) Int. Cl.
*H05K 7/20* (2006.01)
*G06F 1/20* (2006.01)

(52) U.S. Cl.
CPC .............. *G06F 1/20* (2013.01); *H05K 7/20736* (2013.01)
USPC .......................................................... 361/695

(58) Field of Classification Search
USPC .................. 361/688–692, 694–695
See application file for complete search history.

(56) References Cited

U.S. PATENT DOCUMENTS

| | | | | |
|---|---|---|---|---|
| 4,730,233 | A | * | 3/1988 | Osterman ...................... 361/693 |
| 5,412,534 | A | * | 5/1995 | Cutts et al. ..................... 361/695 |
| 5,477,416 | A | * | 12/1995 | Schkrohowsky et al. ..... 361/695 |
| 5,680,294 | A | * | 10/1997 | Stora et al. .................... 361/695 |
| 5,751,549 | A | * | 5/1998 | Eberhardt et al. ........ 361/679.33 |
| 7,535,709 | B2 | * | 5/2009 | Fan et al. ....................... 361/695 |
| 2007/0053169 | A1 | * | 3/2007 | Carlson et al. ................ 361/727 |
| 2008/0043405 | A1 | * | 2/2008 | Lee et al. ....................... 361/600 |
| 2008/0285221 | A1 | * | 11/2008 | Imsand et al. ................ 361/681 |
| 2008/0298014 | A1 | * | 12/2008 | Franco .......................... 361/688 |
| 2009/0086422 | A1 | * | 4/2009 | McClure et al. ......... 361/679.48 |
| 2009/0086441 | A1 | * | 4/2009 | Randall et al. ................ 361/724 |
| 2009/0109619 | A1 | * | 4/2009 | Wise et al. .................... 361/695 |
| 2009/0190301 | A1 | * | 7/2009 | Huang et al. ............. 361/679.46 |
| 2010/0097760 | A1 | * | 4/2010 | Azar et al. ..................... 361/695 |
| 2010/0217909 | A1 | * | 8/2010 | Pavol et al. .................... 710/301 |

* cited by examiner

*Primary Examiner* — Adrian S Wilson
(74) *Attorney, Agent, or Firm* — Morris Manning & Martin LLP; Tim Tingkang Xia, Esq.

(57) ABSTRACT

A server system includes a rack, a server disposed in the rack, an electronic device and a power supply disposed in the rack. The rack includes a first side and a second side opposite to each other, two first brackets, two second brackets and two lateral rails. Each first brackets, disposed at the first side, includes a heat-dissipation part. Each heat-dissipation part includes at least one ventilating perforation. The second brackets are disposed at the second side. The electronic device is disposed between the lateral rails and at the first side. The power supply is disposed between the two lateral rails and at the second side and includes a main body and at least one fan. The main body includes a plurality of through openings facing the ventilating perforations. The at least one fan draws airstreams from the ventilating perforations via the through openings.

12 Claims, 3 Drawing Sheets

SERVER SYSTEM

CROSS-REFERENCE TO RELATED APPLICATIONS

This non-provisional application claims priority under 35 U.S.C. §119(a) on Patent Application No(s). 201210355796.3 filed in China on Sep. 21, 2012, the entire contents of which are hereby incorporated by reference.

BACKGROUND OF THE INVENTION

1. Technical Field of the Invention

The disclosure relates to a server system, and more particularly to a rack server system.

2. Description of the Related Art

In recent years, all kinds of computers, such as a desktop or a laptop, are widely used for not only organizations but also people to do daily tasks. However, with maturity of telecommunication technology and globalization, business models of enterprises are much more complicated than before. The complicated business models lead to generate a large amount of information data but the conventional computers may not deal with the large amount of information data. Therefore, in order to speed up processing the information data, computer manufacturers develop server systems and each of them has specific function (such as a cloud server system or a firewall server system). That is to say, such a server system not only processes the information data together but also speeds up the whole operating efficiency which is much faster than the conventional personal computer. Thus, the server systems are widely used in each organization.

Take a rack server system for an example, the rack server system comprises a rack, multiple servers disposed in the rack and a power supply. In other words, the rack server system contains the multiple servers in the rack. The power supply is used for supplying power to the servers such that the server is enabled to be operated. Such a server system may save space and is easy to be managed, and its servers may be coordinated to execute a large amount of data processing. Therefore, the rack server system is widely adopted in each international enterprise.

However, in the rack server system, only one power supply is adopted to supply power to the servers in the mean time. When the rack server system operates, the power supply generates a great deal of heat. If there is no heat-dissipation device or other structure in the server system to be employed to cool the power supply, the power supply may be unstable, which affects the operation of the server, thereby causing the server system to be damaged. Thus, there is an urgent need for a server system to solve the problem of poor heat-dissipating efficiency in the conventional rack server system.

SUMMARY OF THE INVENTION

An embodiment of the disclosure provides a server system comprising a rack, at least one server, an electronic device and a power supply. The rack includes a first side and a second side opposite to each other, and the rack comprises two first brackets, two second bracket and two lateral rails. The first brackets are disposed at the first side thereof. Each of the first brackets includes a heat-dissipation part, and each of the heat-dissipation parts includes at least one ventilating perforation. The two second brackets are disposed at the second side thereof. Two opposite ends of one of the lateral rails are fixed to one of the first brackets and one of the second brackets, respectively. Two opposite ends of the other lateral rail are fixed to the other first bracket and the other second bracket, respectively. The at least one server is disposed in the rack. The electronic device is disposed between the two lateral rails as well as at the first side. The electronic device is electrically connected to each server. The power supply is disposed between the two lateral rails. The power supply keeps a distance from the electronic device, and the power supply is farther away from the first side of the rack than the electronic device. The power supply is electrically connected to each server. The power supply comprises a main body and at least one fan inside the main body. The main body includes a plurality of through openings facing the electronic device, and the at least one fan is used for drawing airstreams from the ventilating perforations of the heat-dissipation parts to enter the main body via the plurality of through openings.

Another embodiment of the disclosure provides a server system comprising a rack, a plurality of servers, an electronic device and a power supply. The rack has a front side, a rear side, a lower containment space, a middle containment space and an upper containment space. The rack comprises two sets of ventilating perforations at two opposite lateral sides thereof. The plurality of servers are disposed in the upper containment space and the lower containment space. The electronic device is disposed in the middle containment space and at the front side of the rack. The electronic device is electrically connected to each server. The power supply is disposed in the middle containment space and side by side with the electronic device. The power supply keeps a distance from the electronic device, and the power supply is farther away from the front side of the rack than the electronic device. The power supply is electrically connected to each server. The power supply comprises a main body and at least one fan inside the main body. The main body includes a front wall facing the electronic device and a rear wall opposite to the front wall. When the at least one fan works, an airstream drew by the at least one fan passes through one set of ventilating perforations and further bypasses the electronic device from a lateral side of the electronic device and finally passes through the front wall to enter the power supply. Another airstream drew by the at least one fan passes through the other set of ventilating perforations and further bypasses the electronic device from an opposite lateral side of the electronic device and finally passes through the front wall to enter the power supply.

BRIEF DESCRIPTION OF THE DRAWINGS

The present disclosure will become more fully understood from the detailed description given herein below for illustration only, and thus are not limitative of the present disclosure, and wherein.

DETAILED DESCRIPTION

The detailed features and advantages of the disclosure are described below in great detail through the following embodiments, the content of the detailed description is sufficient for those skilled in the art to understand the technical content of the present disclosure and to implement the disclosure there accordingly. Based upon the content of the specification, the claims, and the drawings, those skilled in the art can easily understand the relevant objectives and advantages of the disclosure.

It will be understood that, relative terms, such as "lower" or "bottom", "on" or "top", "left" or "right" may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

An embodiment of the disclosure provides a server system which is used for processing electronic information data. In this embodiment, the server system is a rack server system, but not limited to the disclosure.

Figure 1:
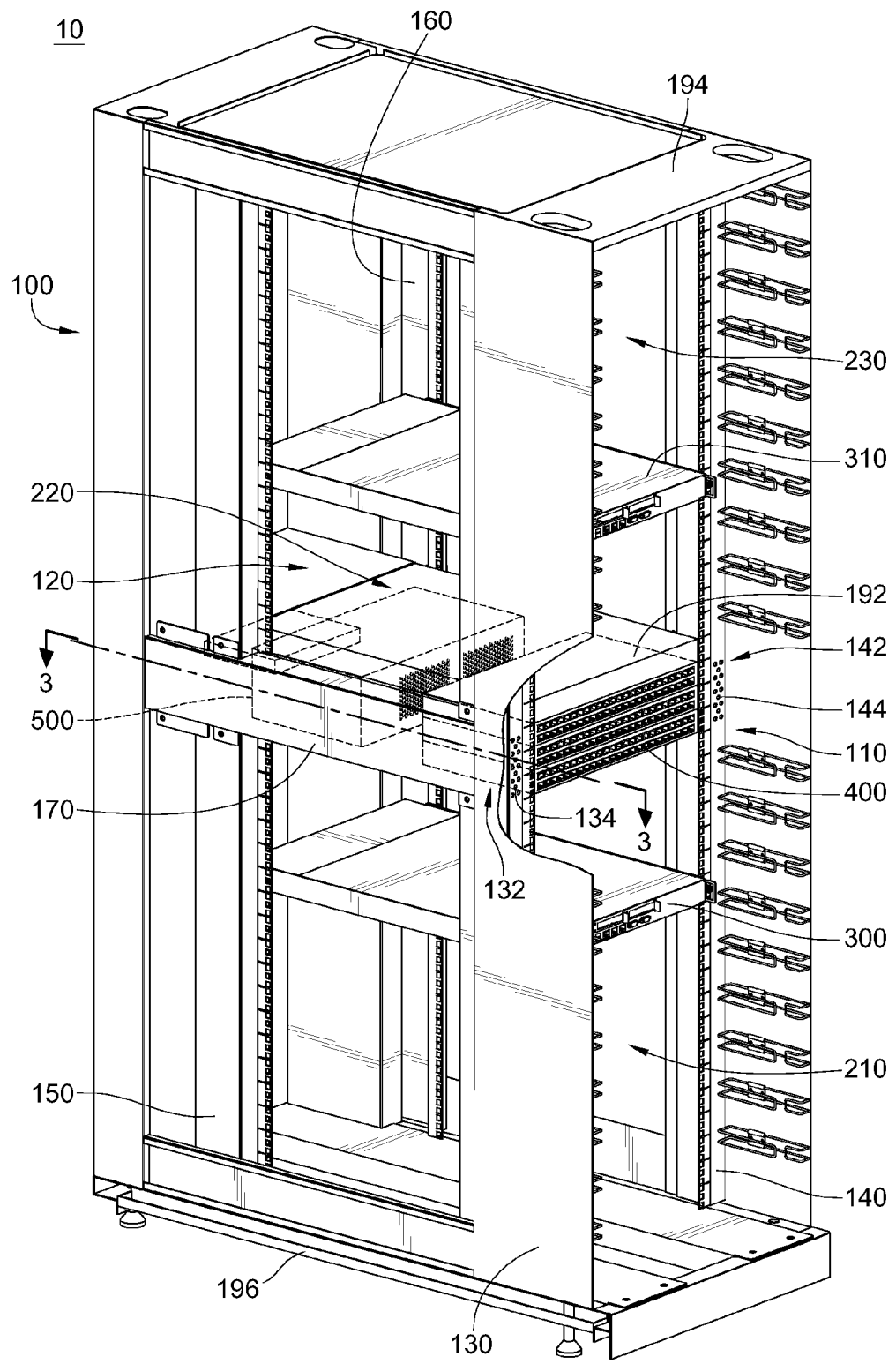
FIG. 1 is a schematic perspective view of a server system according to an embodiment of the disclosure.
Figure 2:
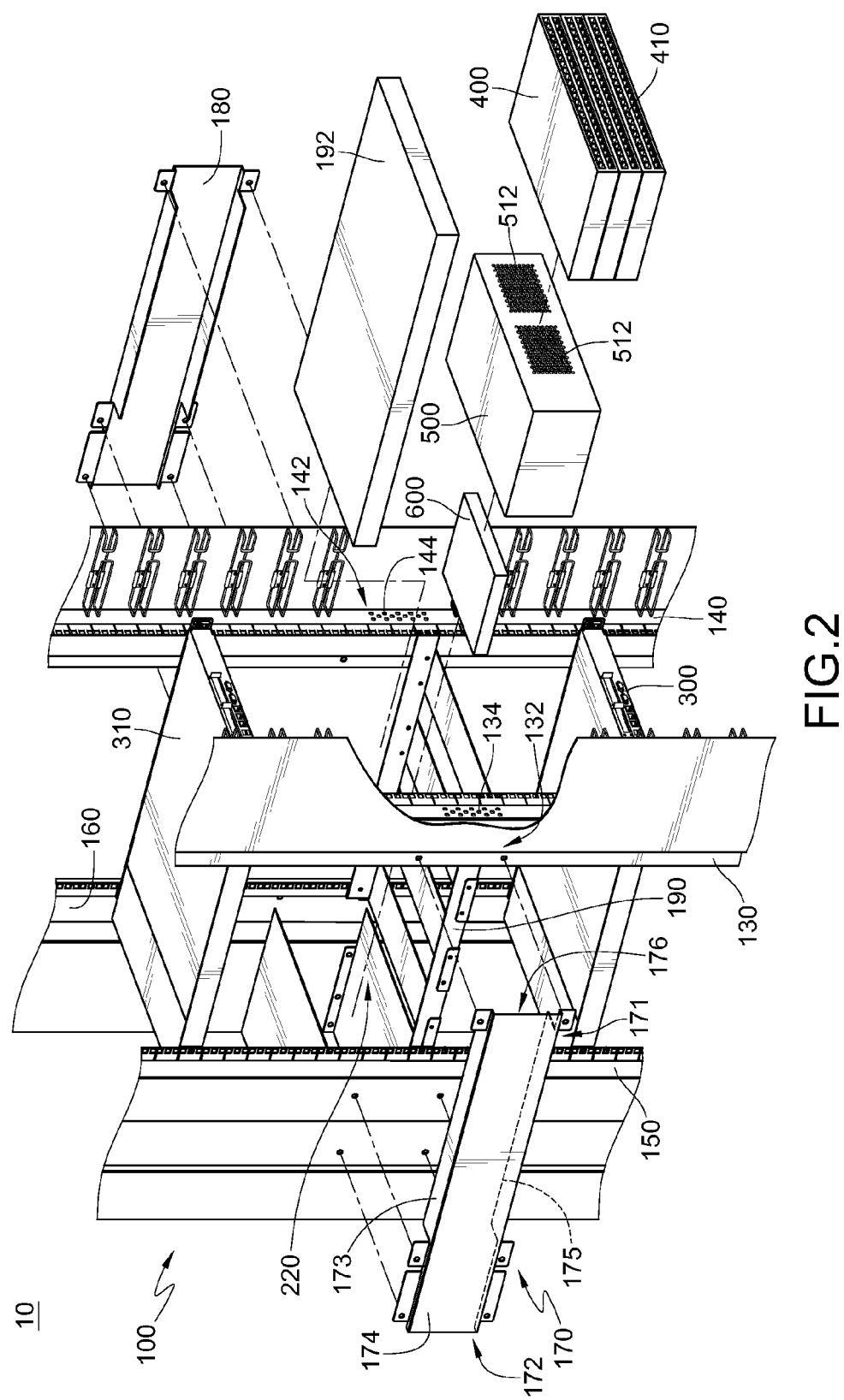
FIG. 2 is a schematic exploded view of a server system according to an embodiment of the disclosure.
Figure 3:
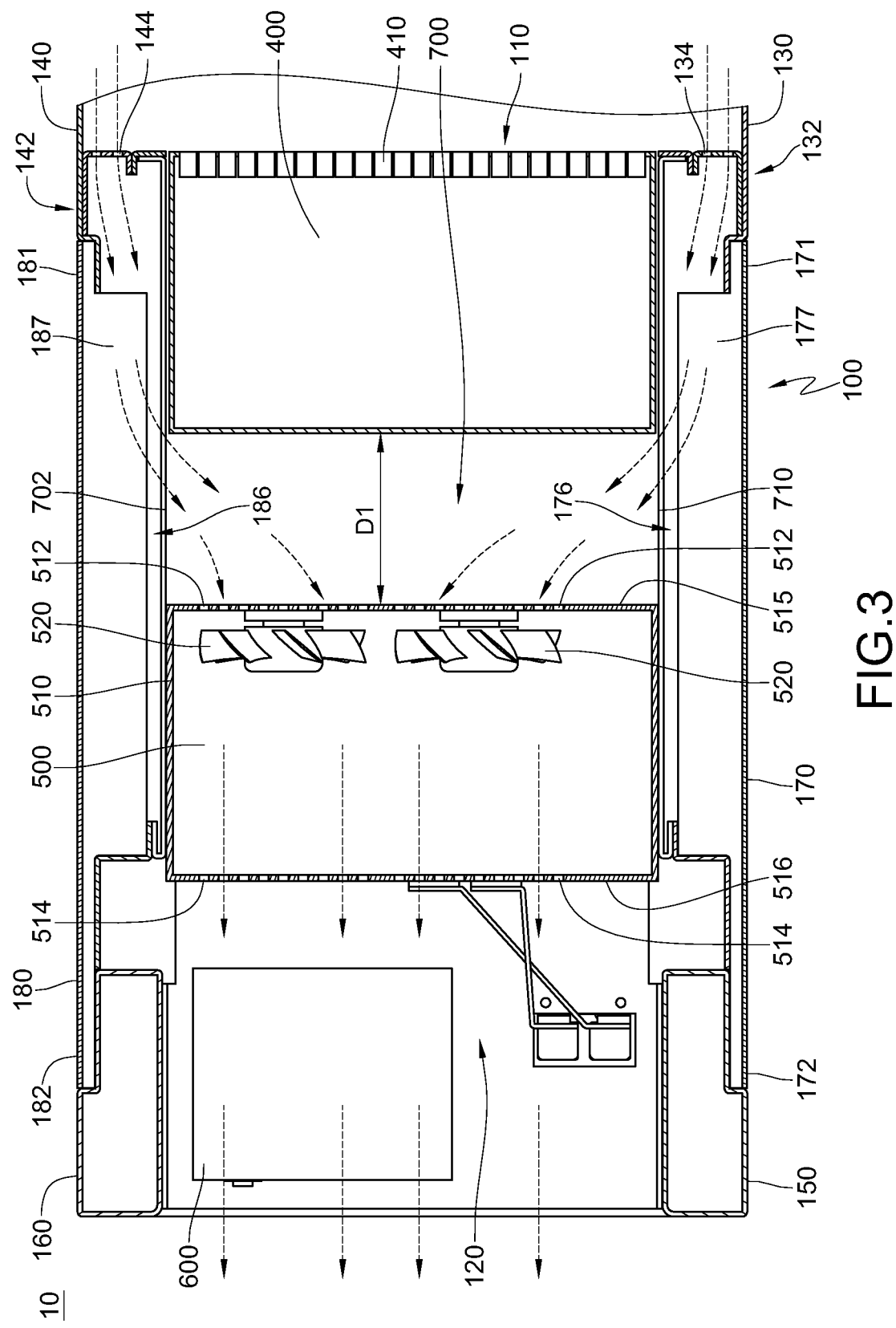
FIG. 3 is a schematic cross-sectional view along a line 3-3 in FIG. 1.

Please refer to FIGS. 1 to 3 together. FIG. 1 is a schematic perspective view of a server system according to an embodiment of the disclosure. FIG. 2 is a schematic exploded view of a server system according to an embodiment of the disclosure. FIG. 3 is a schematic cross-sectional view along a line 3-3 in FIG. 1. In this embodiment, a server system 10 comprises a rack 100, two servers 300 and 310, an electronic device 400 and a power supply 500.

The rack 100 is used for supporting the elements in the server system 10. The rack 100 includes a first side 110 and a second side 120. The first side 110 and the second side 120 are opposite to each other. In the embodiment as drawn the first side 110 and the second side 120 are front side and rear side, respectively. The rack 100 comprises two first brackets 130 and 140, two second brackets 150 and 160, a top board 194, a bottom board 196 and two lateral rails 170 and 180. The first brackets 130 and 140 and the second brackets 150 and 160 are all disposed on the bottom board 196. Furthermore, both the first brackets 130 and 140 are disposed at the first side 110, and both the second brackets 150 and 160 are disposed at the second side 120. The first bracket 130 includes a heat-dissipation part 132 which includes multiple ventilating perforations 134 (which can be taken as a set of the ventilating perforations 134). Similarly, the first bracket 140 includes a heat-dissipation part 142 which includes multiple ventilating perforations 144 (which can be taken as a set of the ventilating perforations 144). The ventilating perforations 134 and 144 are used for enabling airstreams to enter the server system 10 from outside. Moreover, the lateral rail 170 includes a first end 171 and a second end 172 (referring to FIGS. 2 and 3) opposite to each other. The two opposite first ends 171 and second ends 172 of the lateral rail 170 are fixed to the first bracket 130 and the second bracket 150, respectively. The lateral rail 170 extends from the heat-dissipation part 132 of the first bracket 130 toward the second bracket 150 adjacent to each other. Also, the second end 172 of the lateral rail 170 is connected to the second bracket 150. As the same connecting method of the lateral rail 170, the lateral rail 180 is disposed on heat-dissipation part 142 of the first bracket 140 and the second bracket 160 adjacent to the first bracket 140. Two opposite ends 181 and 182 of the lateral rail 180 are fixed to the first bracket 140 and the second bracket 160, respectively In some embodiments, the rack 100 includes the two lateral rails 170 and 180, the following only describes the lateral rail 170. Since the structure of the lateral rail 180 is the same as that of the lateral rail 170, the same structure is not repeated herein. As shown in FIGS. 2 and 3, the lateral rail 170 includes a top part 173, a lateral part 174 and a bottom part 175. The top part 173 and the bottom part 175 are disposed at two opposite side of the lateral part 174 respectively, and the top part 173 and the bottom part 175 both extend from the lateral part 174 toward the power supply 500. Therefore, the top part 173, the lateral part 174 and the bottom part 175 form a channel 177 and an exit opening 176 together. The channel 177 extends from the first end 171 toward the second end 172. The exit opening 176 faces the power supply 500. The airstream may enter the channel 177 via the ventilating perforation 134. Then, the airstream flows out from the lateral rail 170 via the exit opening 176. The structure of the lateral rail 180 is the same as that of the lateral rail 170, so the lateral rail 180 forms a channel 187 and an exit opening 186 which faces the power supply 500 as well.

In some embodiments, please refer to FIG. 2, the rack 100 further comprises a loading tray 190. The loading tray 190 is fastened to the first brackets 130 and 140 and the second brackets 150 and 160 as well as being positioned among the first brackets 130 and 140 and the second brackets 150 and 160. The electronic device 400 and the power supply 500 are both disposed on the loading tray 190 and both positioned between the lateral rails 170 and 180. In other words, the first brackets 130 and 140, the second brackets 150 and 160 and the lateral rails 170 and 180 surround the electronic device 400 and the power supply 500 together (shown in FIG. 3).

Please refer back FIG. 1, in this and some other embodiments, the rack 100 further comprises a cover board 192. The cover board 192 is disposed above the electronic device 400 and power supply 500. The cover board 192 is used for preventing the electronic device 400 and the power supply 500 from exposure to the outside.

Please refer to FIG. 1, in this and some other embodiments, the rack 100 forms a first containment space 210, a second containment space 220 and a third containment space 230. In the embodiment as drawn the first containment space 210, the second containment space 220 and the third containment space 230 are the lower containment space, the middle containment space and the upper containment space, respectively. The first containment space 210, the second containment space 220 and the third containment space 230 are not overlapped to each other. Moreover, the second containment space 220 is positioned between the first containment space 210 and the third containment space 230. In this embodiment, the first containment space 210 is positioned between the second containment space 220 and the bottom board 196. The third containment space 230 is positioned between the second containment space 220 and the top board 194. The first containment space 210 and the third containment space 230 may contain the servers 300 and 310 respectively or together.

The servers 300 and 310 are disposed in the rack 100. In this embodiment, the server 300 is positioned in the first containment space 210, and the server 310 is positioned in the third containment space 230. But the number of the servers is not limited to the disclosure, in other embodiments, the rack 100 may contain a plurality of servers which may be disposed in the first containment space 210 and the third containment space 230, respectively.

In this disclosure, the server is a computing device having independent processing function.

Please refer to FIGS. 1 to 3, the electronic device 400 is disposed between the lateral rails 170 and 180 and positioned at first side 110 of the rack 100. Moreover, the electronic device 400 is also positioned between the cover board 192 and the loading tray 190. The electronic device 400 is connected to each server 300 and 310 and the power supply 500 (the electrical connection is not shown). In this embodiment, the electronic device 400 is a switch, but not limited to the disclosure. In this embodiment, the electronic device 400 (switch) includes multiple network jacks 410. The network jacks 410 face outwardly and oppositely away from the power supply 500.

Please refer to FIGS. 1 to 3 together. The power supply 500 is electrically connected to each server 300 and 310. The power supply 500 is used for receiving an outer power source (not shown). After power from the outer power source is converted by the power supply 500, the power supply 500 supplies the converted power to the elements of the rack 100, such as the electronic device 400, the servers 300 and 310. The power supply 500 is disposed between the lateral rails 170 and 180 as well as at the second side 120, and the power supply 500 is positioned between the cover board 192 and the loading tray 190. The power supply 500 comprises a main body 510 and at least one fan 520. The main body 510 includes a plurality of through openings 512 and a plurality of stream outlets 514. Said in detail, the main body 510 includes a front wall 515 facing the electronic device 400 and a rear wall 516 opposite to the front wall 515. The plurality of through openings 512 are formed on the front wall 515, and the plurality of stream outlets 514 are formed on the rear wall 516. The plurality of through openings 512 face the electronic device 400. The at least one fan 520 is used for drawing the airstreams (such as air) from the ventilating perforations 134 and 144 of the heat-dissipation parts 132 and 142 to enter the main body 510 via the plurality of through openings 512. Afterwards, the airstream is in the main body 510 before flows out from the stream outlets 514 so as to perform a heat exchange with the power supply 500. The electronic device 400 keeps a distance D1 from the power supply 500. The power supply 500 is farther away from the first side 110 of the rack 100 than the electronic device 400. As shown in FIG. 1, in this embodiment, the electronic device 400 and the power supply 500 are positioned in the second containment space 220. As shown in FIG. 3, a first opening 701 facing the lateral rail 170 is formed at an end of the space 700 between the electronic device 400 and the power supply 500, and a second opening 702 facing the lateral rail 180 is formed at an opposite end of the space 700 between the electronic device 400 and the power supply 500. When the at least one fan 520 works, an airstream drew by the at least one fan 520 enters the power supply 500 via the at least one ventilating perforation 134 of the first bracket 130, the first opening 701 and the plurality of through openings 512 in sequence, and another airstream drew by the at least one fan 520 enters the power supply 500 via the at least one ventilating perforation 144 of the first bracket 140, the second opening 702 and the plurality of through openings 512 in sequence.

Please refer FIGS. 2 and 3, in some embodiments, the server system 10 further comprises a rack management controller 600 (RMC). The rack management controller 600 is disposed between lateral rails 170 and 180 as well as at the second side 120. The power supply 500 is positioned between the rack management controller 600 and the electronic device 400. The rack management controller 600 is electrically connected to each server 300 and 310. The rack management controller 600 is used for controlling the whole operation of the servers 300 and 310. Moreover, in this embodiment, the stream outlets 514 of the power supply 500 face the rack management controller 600.

In the embodiment as drawn, when the at least one fan 520 works, an airstream drew by the at least one fan 520 passes through one set of ventilating perforations 134 positioned at a lateral side of the rack 100 and further bypasses the electronic device 400 from a lateral side of the electronic device 400 and finally passes through the front wall 515 to enter the power supply 500, and another airstream drew by the at least one fan 520 passes through the other set of ventilating perforations 144 positioned at an opposite lateral side of the rack 100 and further bypasses the electronic device 400 from an opposite lateral side of the electronic device 400 and finally passes through the front wall 515 to enter the power supply 500. Before entering the power supply 500, the airstream drew by the at least one fan 520 passes through the space between the lateral rail 170 and the electronic device 400 and further enter the space 700 between the electronic device 400 and the power supply 500, and before enter the power supply 500, the another airstream drew by the at least one fan 520 passes through the space between the lateral rail 180 and the electronic device 400 and further enter the space 700 between the electronic device 400 and the power supply 500.

Please refer to FIGS. 1 to 2, from the above description, it can be understood that the electronic device 400, the power supply 500, the rack management controller 600, the lateral rails 170 and 180, the loading tray 190 and the cover board 192 are all disposed in the second containment space 220, and furthermore the power supply 500 is surrounded by the electronic device 400, the rack management controller 600 and the lateral rails 170 and 180 (as shown in FIGS. 1 and 3). However, when being operated to generate heat, the power supply 500 needs outer air to remove the excess heat generated by the power supply 500. Moreover, the outer air at the first side 110 and the power supply 500 are separated and blocked by the electronic device 400 so the power supply 500 may not be in direct and sufficient contact with the outer air at the first side 110. Thus, the power supply 500 needs other channels for transferring the outer air to the power supply 500 to perform heat dissipation. Please refer to FIG. 3, in order to solve the above-mentioned problem, in this embodiment, the first brackets 130 and 140 includes the ventilating perforations 134 and 144, respectively. The outer air (represented by dashed lines) may penetrate through the ventilating perforations 134 and 144 to enter the lateral rails 170, 180 and form airstreams. After the airstreams flows into the lateral rails 170 and 180, the airstreams may bypass the two opposite sides of the electronic device 400 along the channel 177 and 187 formed by the lateral rails 170 and 180. After that, the airstreams further enter the space 700 between the electronic device 400 and the power supply 500 via the exit openings 176 and 186 of the lateral rail 170, and 180. Finally, the airstream may enter the power supply 500 via the plurality of through openings 512. That is to say, When the power supply 500 is operated and the at least one fan 520 rotates, the at least one fan 520 draws the air form the ventilating perforations 134 and 144, and the airstreams formed by the air are transferred to the power supply 500 via the two opposite sides of the electronic device 400, the channels of the lateral rails 170 and 180, the exit openings 176 and 186 (the exit openings 176, 186 are corresponding to the first opening 701 and the second opening 702, respectively) and the space 700 in sequence such that the power supply 500 may perform heat transfer with the airstream. Later, the airstreams which take away the heat is discharged to the surroundings of the rack management controller 600 at the second side 120 via the stream outlets 514. At last, the airstreams are discharged to the outside of the server system 10.

To sum up, according to the above-mentioned embodiments of the disclosure, the server system forms the air channels. The airstreams of the air channels may enter the server system from the ventilating perforations of the first brackets and are guided to flow to the plurality of through openings of the power supply by lateral rails. When the at least one fan of the power supply is operated, the at least one fan draws the airstreams from the ventilating perforations of the first brackets and along the lateral rails to enter the power supply via the plurality of through openings such that the heat-dissipating efficiency of the power supply is optimized. Therefore, compared to the conventional technology, the server system in the embodiments of the disclosure solves the problem of poor heat dissipation of the server system, thereby enhancing the heat dissipating efficiency.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A server system, comprising:
a rack including a first side and a second side opposite to each other, the rack comprising:
two first brackets disposed at the first side thereof, each of the first brackets including a heat-dissipation part, and each of the heat-dissipation parts including at least one ventilating perforation;
two second brackets disposed at the second side thereof; and
two lateral rails, wherein two opposite ends of one of the lateral rails are fixed to one of the first brackets and one of the second brackets, respectively, and wherein two opposite ends of the other lateral rail are fixed to the other first bracket and the other second bracket, respectively;
at least one server disposed in the rack;
an electronic device disposed between the two lateral rails as well as at the first side, wherein the electronic device is electrically connected to each server; and
a power supply disposed between the two lateral rails, wherein the power supply keeps a distance from the electronic device, and the power supply is farther away from the first side of the rack than the electronic device, and wherein the power supply is electrically connected to each server, and wherein the power supply comprises a main body and at least one fan inside the main body, and wherein the main body includes a plurality of through openings facing the electronic device, and wherein the at least one fan is used for drawing airstreams from the ventilating perforations of the heat-dissipation parts to enter the main body via the plurality of through openings.

2. The server system according to claim 1, wherein the rack forms a first containment space, a second containment space and a third containment space; the second containment space is positioned between the first containment space and the third containment space; the at least one server is disposed in the first containment space and the third containment space, and the electronic device and the power supply are both disposed in the second containment space.

3. The server system according to claim 2, wherein the first containment space and the third containment space are used for containing the at least one server.

4. The server system according to claim 1, wherein the rack further comprises a loading tray, wherein the loading tray is fastened to the first brackets and the second brackets; the electronic device and the power supply are disposed on the loading tray, and the electronic device is positioned between the two heat-dissipation parts.

5. The server system according to claim 4, wherein the rack further comprises a cover board, and the electronic device and the power supply are positioned between the cover board and the loading tray.

6. The server system according to claim 1, further comprising a rack management controller disposed between the lateral rails and at the second side thereof; the power supply is positioned between the rack management controller and the electronic device, and the rack management controller is electrically connected to each server.

7. The server system according to claim 1, wherein each of the lateral rails includes a top part, a lateral part and a bottom part; and wherein the top part and the bottom part are disposed at two opposite side of the lateral part respectively and both extend from the lateral part toward the power supply such that the top part and the bottom part form an exit opening together and the exit opening faces the power supply.

8. The server system according to claim 1, wherein the electronic device is a switch; the switch includes a plurality of network jacks, and the plurality of network jack face oppositely away from the power supply.

9. The server system according to claim 1, wherein the rack further comprises a top board and a bottom board, and the top board is connected to the bottom board via the first brackets and the second brackets.

10. The server system according to claim 1, wherein a first opening facing the one of the two lateral rails is formed at an end of a space between the electronic device and the power supply and a second opening facing the other one of the two lateral rails is formed at an opposite end of the space between the electronic device and the power supply; wherein when the at least one fan works, an airstream drew by the at least one fan enters the power supply via the at least one ventilating perforation of the one of the two first brackets, the first opening and the plurality of through openings in sequence, and another airstream drew by the at least one fan enters the power supply via the at least one ventilating perforation of the other one of the two first brackets, the second opening and the plurality of through openings in sequence.

11. A server system, comprising:
a rack having a front side, a rear side, a lower containment space, a middle containment space and an upper containment space, and the rack comprising two sets of ventilating perforations at two opposite lateral sides thereof;
a plurality of servers disposed in the upper containment space and the lower containment space;
an electronic device disposed in the middle containment space and at the front side of the rack, wherein the electronic device is electrically connected to each server; and a power supply disposed in the middle containment space and side by side with the electronic device, wherein the power supply keeps a distance from the electronic device, and the power supply is farther away from the front side of the rack than the electronic device, and wherein the power supply is electrically connected to each server, and wherein the power supply comprises a main body and at least one fan inside the main body, and wherein the main body includes a front wall facing the electronic device and a rear wall opposite to the front wall;

wherein when the at least one fan works, an airstream drew by the at least one fan passes through one set of ventilating perforations and further bypasses the electronic device from a lateral side of the electronic device and finally passes through the front wall to enter the power supply, and another airstream drew by the at least one fan passes through the other set of ventilating perforations and further bypasses the electronic device from an opposite lateral side of the electronic device and finally passes through the front wall to enter the power supply.

12. The server system according to claim 11, further comprising two lateral rails, two first brackets disposed at the front side thereof and two second brackets disposed at the rear side thereof, wherein the two sets of ventilating perforations are formed on the two first brackets, respectively, and wherein two opposite ends of one of the two lateral rails are fixed to one of the two first brackets and one of the two second brackets, respectively, and wherein two opposite ends of the other one of the two lateral rails are fixed to the other one of the two first brackets and the other one of the two second brackets, respectively, and wherein the electronic device and the power supply are both disposed between the two lateral rails, and wherein before entering the power supply, the airstream drew by the at least one fan passes through a space between the one of the two lateral rails and the electronic device and further enters another space between the electronic device and the power supply, and wherein before entering the power supply, the another airstream drew by the at least one fan passes through the space between the other one of the two lateral rails and the electronic device and further enters the space between the electronic device and the power supply.

* * * * *